United States Patent [19]

Lawrence et al.

[11] 4,075,622
[45] Feb. 21, 1978

[54] VARIABLE-TO-BLOCK-WITH-PREFIX SOURCE CODING TECHNIQUE

[75] Inventors: John C. Lawrence, Encinitas; Albert Roth, San Diego, both of Calif.

[73] Assignee: The United States of America as represented by the Secretary of the Navy, Washington, D.C.

[21] Appl. No.: 546,051

[22] Filed: Jan. 31, 1975

[51] Int. Cl.² ........................................... H03K 13/24
[52] U.S. Cl. ........................................... 340/347 DD
[58] Field of Search ............... 340/347 DD, 172.5; 235/154; 179/15 AV

[56] References Cited

U.S. PATENT DOCUMENTS

| | | | |
|---|---|---|---|
| 3,701,108 | 10/1972 | Loh | 340/172.5 |
| 3,717,851 | 2/1973 | Cocke | 340/172.5 |
| 3,835,467 | 9/1974 | Woodrum | 340/347 DD |
| 3,883,847 | 5/1975 | Frank | 340/347 DD |

Primary Examiner—Charles D. Miller
Attorney, Agent, or Firm—R. S. Sciascia; G. J. Rubens; H. Fendelman

[57] ABSTRACT

A method and apparatus for data compression which utilizes a random walk through Pascal's triangle which is directed by the incoming random source sequence. The random walk starts at the apex of Pascal's triangle and proceeds downward according to an algorithm until it terminates at a boundary which has been constructed in such a way that the encoding of each source sequence can be accomplished in a fixed number of bits. The fixed-length encoded block consists of a prefix to determine the boundary crossing point in Pascal's triangle and a suffix which represents the encoded form of the input sequence relative to that starting point. Theoretically optimal entropy encoding is achieved by this method.

15 Claims, 13 Drawing Figures

VARIABLE-TO-BLOCK-WITH-PREFIX SOURCE CODING TECHNIQUE

BACKGROUND OF THE INVENTION

Source coding or data compression techniques are useful in reducing the volume of data generated by a source for the purpose of transmission over a channel or storage. Economies are realized when the volume of data to be transmitted or stored is decreased. There are two kinds of data compression techniques; information preserving and information degrading. A process is information preserving if all the information present before coding can be regenerated after coding. Conversely, a process is information degrading if it is irreversible in the sense that the original information cannot be regenerated exactly after the process is performed. An information degrading process can be used when the user of the information is not interested in all the information generated by the source. If the user is only selectively interested in the information, the information degrading source coding process can reflect that selectivity. Also, if the user is willing to accept a fidelity criterion, the data may be degraded within certain limits and still remain useful. In general, more data compression can be attained with information degrading processes than with information preserving processes.

Source coding systems can be classified as statistical or ad hoc, depending on whether or not the system is in some sense optimal in terms of Shannon's noiseless coding theorem. A final classification of source coding systems is the following: if the system accepts digits from the source in fixed length blocks and then generates a variable length sequence of encoded digits, the system is "block-to-variable"; if the system accepts a variable length sequence of digits from the source and generates a fixed length block of digits the system is "variable-to-block."

The first optimal coding scheme to be developed was Huffman coding. This technique is block-to-variable. Huffman coding specifies the optimal coding for M messages with probabilities $p_1, p_2, \ldots, p_m$, where $p$ is the probability that a "1" is emitted. The least probable message is assigned a code word containing the longest sequence of bits and more probable messages are assigned code words of shorter length. When Huffman coding is applied to a binary memoryless source, the source sequence must be broken up into blocks N bits long. Each block then contains one of $M = 2^N$ possible messages. As N gets large it becomes impractical to calculate the probability of each message and to generate the corresponding code word. However, Huffman coding is only optimal as N approaches infinity. Furthermore, this coding scheme requires knowledge of the source statistics and the code words must be computed a priori. The code words must be stored in the memory of the encoder and a table lock-up performed on each block. The memory requirements grow exponentially with N. In short, complexity and required knowledge of the source statistics detract from the desirability of Huffman coding.

Run length coding is an ad hoc coding scheme that works well when $p$ is either very small or very large. In its simplest implementation the number of consecutive zeros is counted. When the first "1" is encountered, the number of zeros is transmitted as a block of binary digits. Thus, run length coding is variable-to-block and this fact simplifies the hardware considerably. Run length coding is, however, limited by the fact that it is reasonably efficient only when $p$ is very small or very large and even in these cases it is not optimal.

The Schalkwijk algorithm is based on the ranking of binary sequences of length N and weight W. For a binary memoryless source characterized by $p$, as N approaches infinity, we expect to get a weight, $W = pN$, with a probability equal to 1. The basic idea is to rank all sequences of length N and containing $W = pN$ ones. Thus, the binary encoding of the sequence is its rank in binary form. Schalkwijk has shown that as N approaches infinity this technique is optimal. Since there are $\binom{N}{W}$ possible sequences, i.e., $$\frac{N!}{(N-W)!W!},$$

each member can be encoded in a word of $\log_2\binom{N}{W}$ bits. Thus, the compression ratio achieved is $$\frac{N}{\log_2\binom{N}{W}},$$

which approaches the theoretical limit $H(W/N)^{-1}$ as N approaches infinity. Mathematically, the rank of the sequence is given by, $$i(t) = \sum_{K=1}^{N} t_K \binom{N-K}{W_K} \text{ where } t = (t_1, t_2, \ldots, t_N) \epsilon T(N, w), \text{ and}$$

where $T(N,W)$ = the set of all binary sequences of length N and weight W, where $t_K \epsilon [0,1] = K^{th}$ member of $t$, and where $$W_K = \sum_{i=K}^{N} t_i.$$

Figure 1:
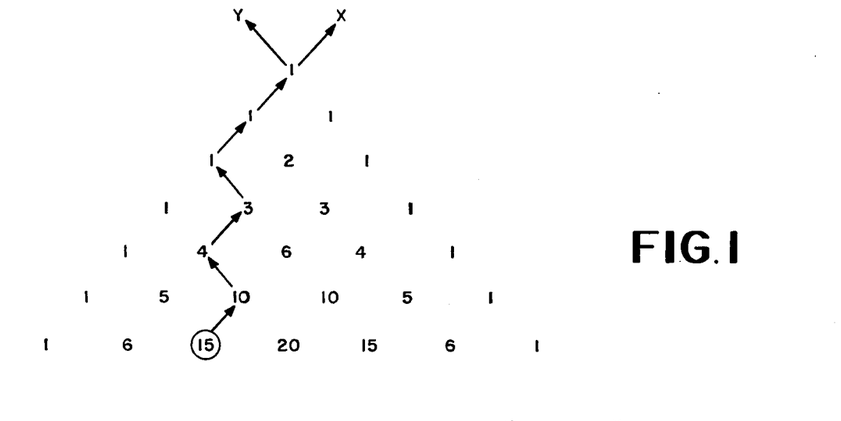
FIG. 1 is a diagram of a ranking algorithm using Pascal's triangle.

An understanding of the above formula can be facilitated by visualizing it as a random walk through Pascal's triangle determined by the bits in the input sequence, starting at the $W^{th}$ position of the $N^{th}$ row, i.e., at the entry corresponding to $\binom{N}{W}$ and terminating at the apex. FIG. 1 illustrates the computation for the sequence 010100.

Given the rank $i(t) = 8$, the original sequence $t$ can be reconstructed by using the following algorithm. Start at $\binom{6}{2} = 15$ in FIG. 1. The rank 8 of the sequence is less than the number 10, at a single step in the X-direction from the current starting point 15. Move one step in the X-direction, toward 10 and record a 0. The rank 8 of the sequence $t$ is not less than the number 6, at a single step in the X-direction from the current starting point 10. Move one step in the Y-direction, towards 4; substract the number 6 used in the comparison from the rank 8 of the sequence $t$, giving a new rank $8 - 6 = 2$ and a record a 1 giving 01. The current rank 2 of the sequence $t$ is less than the number 3 at a single step in the X-direction from the current starting point 4. Move one step in the X-direction towards 3 and record a 0, giving 010. The current rank 2 of the sequence is not less than the number 2 at a single step in the X-direction from the current starting point 3. Move one step in the Y-direction towards 1; subtract the number 2 used in the comparison from the current rank 2 of the sequence $t$, giving a new rank $2 - 2 = 0$ and record a 1, giving 0101. The current rank of the sequence $t$ is now 0. Thus the last two steps are taken in the X-direction, resulting in the desired sequence 010100.

Table I below gives the complete set T(6,2) with the corresponding ranks of the sequences.

TABLE 1.

SET, T(6,2), WITH CORRESPONDING RANKING

| Rank | Sequence |
|------|----------|
| 0    | 000011   |
| 1    | 000101   |
| 2    | 000110   |
| 3    | 001001   |
| 4    | 001010   |
| 5    | 001100   |
| 6    | 010001   |
| 7    | 010010   |
| 8    | 010100   |
| 9    | 011000   |
| 10   | 100001   |
| 11   | 100010   |
| 12   | 100100   |
| 13   | 101000   |
| 14   | 110000   |

Schalkwijk developed two schemes for implementation of this ranking procedure: (1) Variable-to-block coding and (2) Block-to-variable coding.

The variable-to-block coding scheme accounts in the following way for the fact that an actual source sequence of N bits may not contain exactly W ones. The starting point for the coding process is the entry in Pascal's triangle which equals $(_w^N)$. Bits are accepted from the source one at a time. Let $n$ be the number of bits that have been accepted at any point and $w$ the weight of the accepted sequence. If for $n < N$, the weight of the accepted sequence equals W, source bits are no longer accepted and the accepted sequence is filled out with $N - n$ dummy zeros. If for $n < N$, $W - w = N - n$, source bits are no longer accepted and the sequence is filled out with $W - w$ dummy ones. In any case at most $N - 1$ source digits are accepted followed by a dummy digit.

Figure 2:
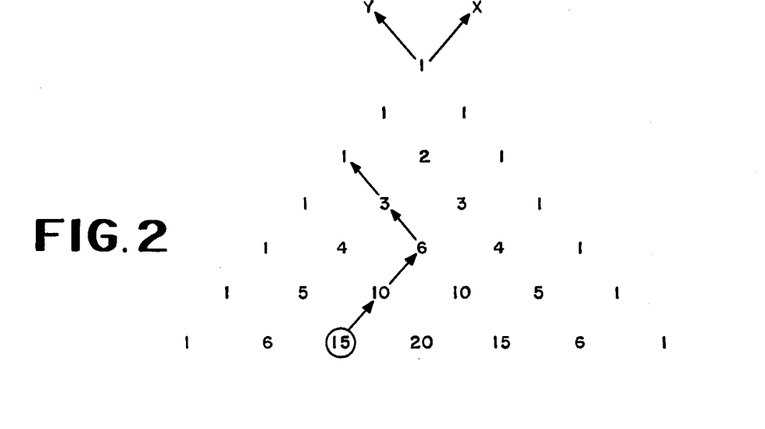
FIG. 2 is a diagram of a variable-to-block prior art coding technique using Pascal's triangle.

FIG. 2 illustrates how the algorithm works when visualized as a random walk in Pascal's triangle. The walk starts, for example, at $(_2^6) = 15$. Assume that the incoming sequence is 001101. . . . For each 0 encountered a step in the X-direction is taken and for each 1 encountered a step in the Y-direction is taken. Thus, two steps in the X-direction are taken to arrive at 6, the second element in the fourth row and then two steps in the Y-direction are taken to arrive at 1, the $0^{th}$ element of the second row. Since this last element is on a boundary, the sequence is filled out with dummy zeros. Thus $i(001100) = 5 = 0101$ is transmitted. If the right hand boundary had been reached the sequence would have been filled out with dummy ones. The decoder looks at the decoded sequence and, if the last bit is a zero, strips off all zeros until it comes to a one. If the last bit is a 1, it strips off all ones until it comes to a zero.

The main limitation of Schalkwijk's variable-to-block scheme is the fact that the source statistics must be known a priori. For sources of unknown, nonstationary, or time-varying statistics, this scheme is unrealistic. Also, even for sources of known statistics, Schalkwijk's theory gives no reasonable way to decide upon the block length as a function of source statistics, equipment complexity, and compression ratio for finite block length.

Schalkwijk's second scheme, block-to-variable coding accounts in the following way for the fact that an actual source sequence of N bits may not contain exactly W ones. A block of N source bits is accepted. The weight W of the block is measured. The starting point in Pascal's triangle is determined by W and is the point on the $N^{th}$ line whose entry is equal to $(_W^N)$. The encoded block will be of variable length depending on the weight of W. A prefix of $\log_2(N + 1)$ bits is attached to the encoded word to distinguish among the $N + 1$ position on the $N^{th}$ line and communicate this starting point information to the decoder. The prefix contains the weight W.

Figure 3:
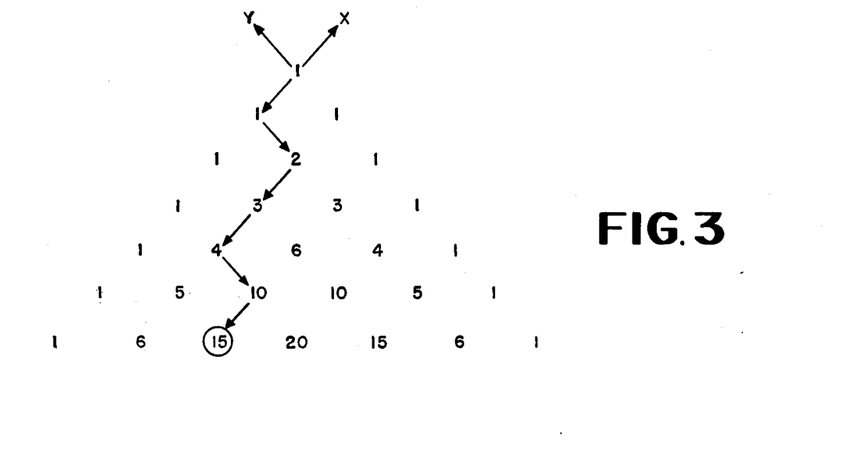
FIG. 3 is a diagram of a block-to-variable piror art coding technique using Pascal's triangle.

The process can be visualized as a random walk in Pascal's triangle, starting at the apex, by referring to FIG. 3. Let the block length $N = 6$. Assume that the input sequence is 0100101100. . . . The coder looks at the first six bits, notices that there are two ones, and sets the starting point at $(_2^6) = 15$. The coding process terminates when the boundary corresponding to the block length is reached, in this case the sixth row. The walk starts with a step in the X-direction corresponding to the first zero, and proceeds with a step in the Y-direction corresponding to the first 1, and 1 is added to the running suffix giving a total of 1. Next, two steps in the X-direction followed by one step in the Y-direction are taken and 6 is added to the running suffix giving 7. Next one step in the X-direction is taken, arriving at $(_2^6) = 15$, and here the process terminates. The coded suffix equals 7.

The limitation of this scheme is complexity. Taking as a measure of complexity the number of bits required to store Pascal's triangle in memory, we have the following result: Complexity = $N(N + 1)(N + 2)/2 = N^3 + 3N^2 + 2N/2$. There are $(N + 1)(N + 2)/2$ words and the maximum word length is approximately N bits. In a practical system all words would have to be standardized at N bits even though the transmitted word length might be less than N. From the above result it can be seen that the complexity increases exponentially with the block length N. The most serious drawback to the Schalkwijk block-to-variable scheme is that the complexity of the hardware required to approach optimum increases as the entropy decreases. This is the opposite of what should be the case. The reason for this perverse behavior of the Schalkwijk block-to-variable scheme is the following. The length of the prefix sets a limit on the maximum obtainable compression. This limit is equal to the input block length divided by the length of the prefix, which equals the logarithm to the base 2 of the input block length plus 1.

Table 2 below gives the length of the prefix as the function of input block length.

TABLE 2.

PREFIX AS A FUNCTION OF INPUT BLOCK LENGTH

| Prefix Length | Input Block Length |
|---------------|--------------------|
| 2             | 2                  |
| 3             | 4                  |
| 4             | 8                  |
| 5             | 16                 |
| 6             | 32                 |
| 7             | 64                 |
| 8             | 128                |
| 9             | 256                |
| 10            | 512                |
| 11            | 1024               |

A further drawback to the block-to-variable scheme is that for any particular input block length N, the word length within the hardware implementation must also be N, although for low entropy blocks the length of the coded output will be much less than N. There is inefficient use of space within the hardware since the full word length is utilized only when $W = N/2$. In other cases of low entropy, the additional complexity implied by the longer word length is wasted.

SUMMARY OF THE INVENTION

The coding scheme of the present invention overcomes the disadvantages of the prior art coding schemes while retaining the advantage of not requiring knowledge of the source statistics. Memory requirements are greatly reduced since it is necessary to store only a small portion of Pascal's triangle.

In the coding scheme of the present invention, a variable length source sequence of length $N_i$ is converted into a fixed-length encoded sequence of length $N_0$. The output block is comprised of an encoded suffix and a number of prefixes. The suffix contains the rank of the input sequence computed by means of Pascal's triangle with reference to a starting point determined by the length and weight of the input sequence. The first prefix contains a number which represents the length of the input sequence. This determines the starting point in Pascal's triangle for the decoder.

The algorithm of the present invention works as follows. Assume $n$ is the running length of the source subsequence and that $w$ is the running weight. Assume further that the element of Pascal's triangle equal to $\binom{n}{w}$ is identified as the $(n,w)^{th}$ element. This element corresponds to the $w^{th}$ position of the $n^{th}$ row. The incoming bits to the source coder determine a random walk in the Pascal's triangle starting at the apex, taking a step in the X-direction if a 0 is received or a step in the Y-direction if a 1 is received. In addition, when a step in the Y-direction is taken, the number which is one step in the X-direction above the new position is added to the running sum, which becomes the suffix when the run terminates. This random walk continues until a boundary is reached. The boundary is described as follows: The boundary point for each $n$ is the largest entry $(n,w)$ such that $\log_2\binom{n}{w} < S$ where S is the length of the suffix. The boundary is the set of all boundary points. The boundary must be modified for large $n$ so that the number of boundary points does not get too large since this would necessitate a large prefix size. This is done by truncating the Pascal's triangle at a certain point. The random walk terminates as soon as the boundary is crossed. The input sequence is taken as the sequence of bits up to, but not including, the one that resulted in the crossing of the boundary. The point at which the source sequence is terminated becomes the starting point for the decoding process.

A second one bit prefix determines whether the majority of the bits in the input sequence are zeros or ones. A third one bit prefix determines whether the source sequence is to be coded or sent straight through as generated by the source. If it is sent straight through, the source sequence is called an "elemental" run. If it is coded, it is called a "coded" run. If the run is elemental it consists of the one bit prefix followed by $N_0 - 1$ source bits. There is a need for the elemental run since there exists the possibility of crossing the boundary such that $N_i < N_0$. The provision of the elemental run insures that the compression ratio is never less than $N_0 - 1/N_0$ for any particular block.

A final prefix may also be necessary to determine whether the boundary is discontinuous at the row in Pascal's triangle corresponding to the termination of a run. A boundary is discontinuous if there are two possible termination points on that row. For example, in FIG. 4, row 11 is 1, 11, 55, 0. The next row is 1, 12, 0. Therefore, the termination point in row 11 could be either 11 or 55 since the boundary could be crossed from either element. It is to clear up this ambiguity at these discontinuous boundary points that this last one bit prefix is provided.

In a second embodiment of the coding scheme of the present invention, the discontinuity prefix described above is unnecessary as will be described below.

STATEMENT OF THE OBJECTS OF THE INVENTION

Accordingly it is the primary object of the present invention to disclose a novel method and apparatus for data compression.

It is a further object of the present invention to disclose a novel block-to-variable coding scheme.

It is a further object of the present invention to disclose a novel information preserving coding scheme not requiring knowledge of the source statistics.

It is still a further object of the present invention to disclose a novel technique of data compression which is capable of being applied to general sources and is, therefore, a universal coding scheme.

It is another object of the present invention to disclose a novel technique of data compression in which the smaller the entropy of the data, the longer is the run which the technique is capable of accepting.

Another object of the present invention is to disclose a novel data compression technique which is capable of handling sources of time-varying and non-stationary statistics since it has a built-in mechanism that tends to break up the incoming source sequence in such a way as to maximize the overall compression.

Other objects, advantages and novel features of the invention will become apparent from the following detailed description of the invention when considered in conjunction with the accompanying drawings.

DESCRIPTION OF THE PREFERRED EMBODIMENT

Figure 4:
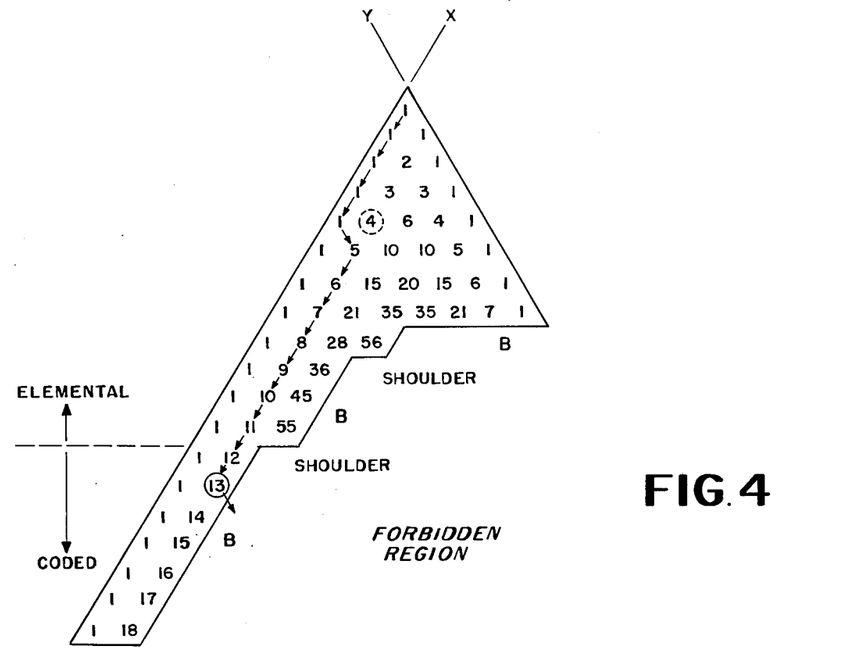
FIG. 4 is a diagram of the variable-to-block-with-prefix coding scheme of the present invention using Pascal's triangle and illustrating the novel concept of providing a boundary in the triangle.

To facilitate an understanding of the basis of the present invention the following example is given to make the coding process clear. The structure of the relevant portion of Pascal's triangle for this example is illustrated in FIG. 4. Assume in this example that the suffix is six bits long and the prefix which represents the length of the source run is three bits long so that with the other three 1-bit prefixes the total length of the encoded block is $N_0 = 12$. It is noted that the 1 at the apex of Pascal's triangle is the $0^{th}$ element in the $0^{th}$ row, that the two ones beneath the apex 1 comprise the first row, etc., and that each element in the triangle is equal to the sum of the two elements directly above and straddling it. According to the present invention, the greatest element provided in Pascal's triangle is equal to $2^S - 1$ or $2^6 - 1 = 63$ in the present example. This limitation determines the boundary B in Pascal's triangle illustrated in FIG. 4 utilized in the present invention. In the hardware implementation described below, the element in each row adjacent the boundary contains an additional most significant bit (MSB) which is a "1" which enables a boundary crossing determination. Let the incoming source sequence be, for example, 00001000000001000... Starting at the apex in FIG. 4, a step in the X-direction is taken when a 0 comes in and a step in the Y-direction is taken when a 1 comes in until the boundary is crossed. The first four source bits are zeros, so 4 steps in the X-direction are taken. Since the next bit is a 1, 1 step in the Y-direction is taken and a 4 is recorded, the 4 being circled by a dotted line in FIG. 4. The next eight bits are zeros, so 8 steps in the X-direction are taken. The next bit is a 1, so 1 step in the Y-direction is taken, but since this results in the boundary being crossed, this step is not added to the sequence, and the input sequence is terminated. The suffix then is 4 = 000100. The path of the random walk for this example is illustrated in FIG. 4 by arrows and the starting point for the decoder is (13,1) = 13, which is encircled.

The decision as to whether the run is to be coded 0 or 1 is made at the seventh row, the last row in which all elements in a row are registered. The run is coded 0 if $w \leq 3$, coded 1 otherwise. This makes it unnecessary to duplicate the right-hand symmetrical part of Pascal's triangle beyond the seventh row. In the hardware implementation each boundary element is coded so that it can be determined when the boundary is crossed. The decision as to whether to send an elemental or coded run is made at the twelfth row, since 12, in the present example, is the number of digits in the encoded block. If the boundary has not been crossed prior to reaching the twelfth row, a coded run is sent. If the boundary was crossed previously an elemental run is sent. The dotted line between the eleventh and twelfth rows demarcates the elemental and coded regions. The Pascal's triangle is truncated at the eighteenth row in this example for purposes of simplicity. In the hardware implementation, the triangle is truncated such that the length of the coded run can fit into the prefix which tells the decoder the starting point.

The prefix which distinguishes the starting point at a discontinuity in the boundary is denoted the "housekeeping" prefix. This prefix is arbitrarily chosen to be a 0 to indicate that the starting point is at the last non-0 entry on the line and a 1 to indicate the next to the last non-0 entry.

From FIG. 4 it can be seen that there are no discontinuities after row 11 up until truncation. If row 11 were in the coded rather than in the elemental region, the housekeeping prefix would be necessary to distinguish between the starting points (11,1) = 11 and (11,2) = 55. Table 3 below gives the starting point prefix as a function of run length, $N_i$.

TABLE 3.

STARTING POINT PREFIX AS A FUNCTION OF RUN LENGTH

| $N_i$ | Starting Point | Starting Point Prefix |
|---|---|---|
| 12 | 12 | 000 |
| 13 | 13 | 001 |
| 14 | 14 | 010 |
| 15 | 15 | 011 |
| 16 | 16 | 100 |
| 17 | 17 | 101 |
| 18 | 18 | 110 |
| 18 | 1 | 111 |

It is noted that starting point prefixes may be assigned as in Table III, i.e., beginning with the first row in the coded region, or for simplicity as in the hardware implementation described below, they may be assigned in accordance with the actual row of Pascal's triangle on which the run is terminated.

The following conventions have been chosen for the remaining two prefixes. A "0" is assigned for an elemental run and a "1" is assigned for a coded run. A "0" is assigned for a 0-coded run and a "1" is assigned for a 1-coded run.

To summarize the example, the incoming sequence resulted in a coded run, 0-coded, "housekeeping" prefix = 0, starting point prefix = 001. Therefore the encoded block is the following:

| Prefixes | Suffix |
|---|---|
| 1 0 0    001 | 000100 |

The last prefix, 001, is the starting point prefix, the third prefix, 0, is the housekeeping prefix, the second prefix, 0, is the 0 or 1 coded prefix and the first prefix, 1, is the elemental or coded prefix.

At the decoder the first four prefixes are first stripped off, thus providing the information that (1) the block is coded, not elemental, (2) it is 0-coded rather than 1-coded, (3) no housekeeping action is required, (4) the starting point is (13,1) = 13. The suffix 000100 = 4 is compared with the number one step in the X-direction from 13, which is 12, and since 12 > 4, one step in the X-direction is taken and a 0 is recorded. Similarly, seven more zeros are recorded which results at (5,1) = 5. Then, since the number one step in the X-direction from (5,1) is 4 and since $4 \leq 4$, we subtract 4 − 4 = 0, record a 1, and move one step in the Y-direction. This results in the sequence 000000001. Since 1 > 0, 4 steps in the X-direction are taken, arriving at the stopping point, which is the apex (0,0). The decoded run is, therefore, 0000000010000, which must be reversed in order to get back to the original sequence.

A slightly modified version of the above described variable-to-block-with-prefix scheme has even better properties. In this scheme the starting point prefix, rather than being a function of input run length, becomes a function of suffix length. In fact, its length becomes $\sim \log_2 S$ rather than $\sim \log_2 N_i$ bits. The modified scheme works as follows.

Figure 5:
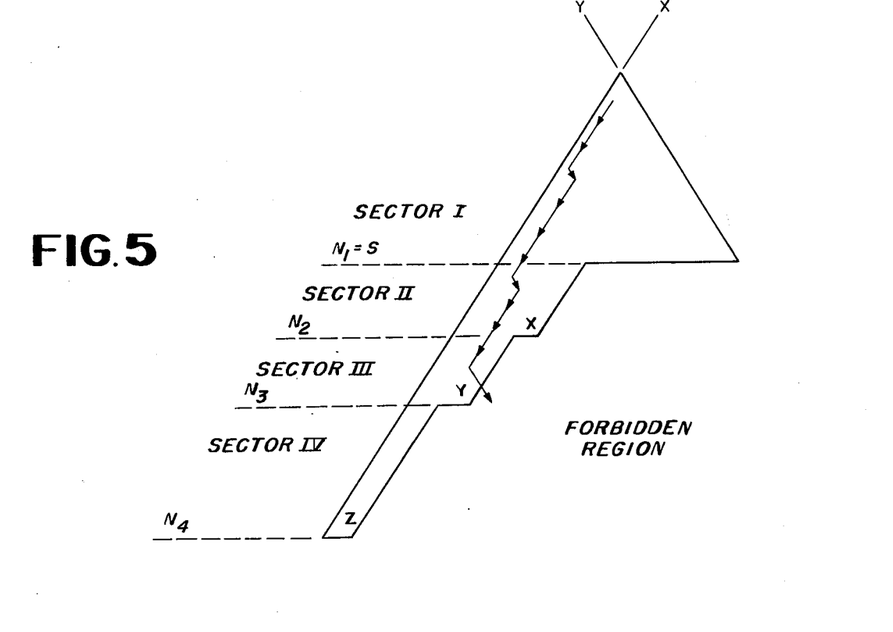
FIG. 5 is a diagram of the variable-to-block-with-prefix coding scheme of a second embodiment of the present invention.

For the sake of clarity, consideration of an elemental block is omitted although this could easily be provided in practice. In FIG. 5 Pascal's triangle has been divided into several sectors. In sector I all entries are less than $2^S$. The boundary line between sectors I and II occurs at the last row in which all of the entries are less than $2^S$ where S is the number of bits in the suffix. This will be approximately the S row. The source sequence can contain at most S ones at this point. So in sector I a source sequence can contain at most S ones. In sector II a permissable source sequence between the lengths $N_1$ and $N_2$ can contain at most $(S/2 - 1)$ ones, in sector III, $(S/2 - 2)$ ones, etc. The boundary is discontinuous between sectors, moving one step to the left at each sector. In each sector a source sequence within that sector can contain a maximum number of ones equal to 1 less than the number permitted in the sector preceding it. Therefore, there will be approximately S/2 sectors in all.

The basic idea is that the terminating point for the encoding process, which is the same as the starting point for the decoding process, is allowed to occur at only one specified point in each sector as opposed to being allowed to occur at any of the boundary points in the scheme described above. These points are denoted X, Y, and Z in FIG. 5. Therefore, there are at most S/2 allowable starting points and the prefix need be only $(\log_2 S - 1)$ bits long.

Starting at the apex, the random walk dictated by the incoming source bits proceeds as in the block-to-variable version described above. Assume that the boundary between allowable and forbidden sectors is arrived at in sector III. The last boundary point in each sector becomes the starting point, and the sector number is transmitted as the starting point prefix. At the decoder, the starting point is the last boundary element in the sector and the decoding proceeds as in the scheme described above except that all initial consecutive zeros are eliminated until a "1" is arrived at. This brings the decoder to the boundary element at which the encoder terminated the source block. The decoder then generates the source sequence in reverse order starting from this point.

There is one special case to be considered. This involves the boundary row between sectors. These rows contain, by construction, at least two boundary elements. The minimum boundary element belongs to the succeeding sector and the maximum boundary element belongs to the preceding region. A source sequence which ends in a "0" may reach the minimum boundary element on a boundary row between sectors. In all other cases the source sequence would end in a "1". Therefore, the decoder must not strip off more dummy zeros from the decoded sequence than a number equal to the number of rows of Pascal's triangle in that particular region. The last row of the last region will be the $(2^S - 1)^{th}$ row. Therefore, the longest possible source run is $2^S - 1$ bits. The $(2^S - 1)^{th}$ row consists of the elements of 1 and $2^S - 1$. The element $2^S - 1$ is the starting point for the next to last region, and the element 1 is the starting point for the last region.

Figure 6:
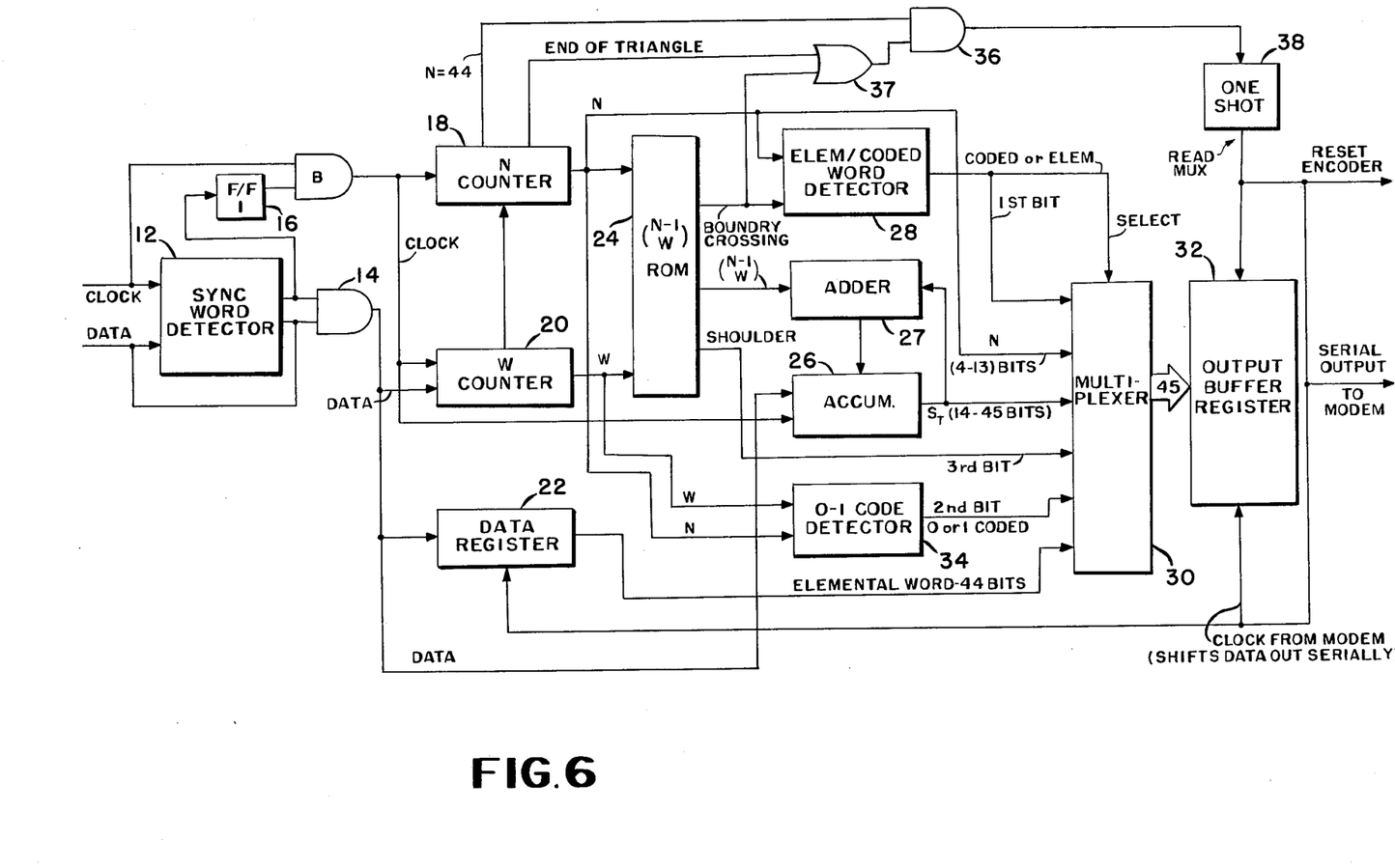
FIG. 6 is a network diagram of the encoder of the present invention.

Referring now to FIG. 6, the encoder of the present invention will be described. Arbitrary hardware parameters have been chosen for purposes of explanation but it is to be understood that these parameters are strictly arbitrary and depend upon engineering convenience and desired performance. In the present embodiment, a suffix length of 32 bits is considered. Therefore, no word in Pascal's triangle will be longer than 32 bits. The starting point prefix P of 10 bits is chosen. This means that there are 1023 allowable starting points in Pascal's triangle. A one bit prefix distinguishes between elemental and coded runs. Similarly, another one bit prefix distinguishes between "0" or "1" coded runs. Finally a one bit prefix distinguishes between starting points above shoulders and those not above shoulders (a shoulder is defined as that portion of the boundary in Pascal's triangle which runs along a single row). This makes the output block length 45 bits. Let N be the length of the sequence of accepted source bits. Then, if a boundary is crossed in Pascal's triangle such that $N < 45$, an elemental block is outputted. Otherwise, a coded block is outputted.

A synchronization word is generated at the start of each frame. The sync word detector 12 enables AND gate 14 and triggers flip-flop 16 upon detection of the synchronization word, allowing clock pulses to enter the N counter 18 and data to enter the W counter 20 and data register 22. The N counter 18 keeps track of the number of data bits and the W counter 20 counts the number of "1"'s in the data stream. The data register 22 is 44 bits in length and preserves the first 44 bits of the incoming data in the case that an elemental run is called for. Together the N and W counters supply the address to the ROM (Read Only Memory) 24 which contains the relevant portion of Pascal's triangle. If the contents of the N counter 18 is $n$ and the contents of the W counter 20 is $w$, the output of the ROM 24 is $\binom{n-1}{w}$ which is the $w^{th}$ word of the $(n - 1)^{st}$ row of Pascal's triangle. Adder 27 adds this to the contents of accumulator 26 (which contains the running suffix) if the data bit was a 1. Otherwise the accumulator is inhibited from accepting the result of the addition.

When the boundary is crossed, the ROM 24 generates a signal on the "boundary crossing" line. FIG. 6c illustrates the portion of ROM 24 that generates the boundary crossing signal. Each of the elements adjacent the boundary in Pascal's triangle, as stored in ROM 24a, includes two additional bits (flags). For all non-shoulder boundary elements, the leftmost additional bit is a "1" and the other bit is "0"; for shoulder boundary elements, e.g., elements 55 and 56 in FIG. 4, the rightmost additional bit is a "1" and the other bit is a "0". In both cases, the additional bits are used only as flags, and do not constitute part of the suffix. When a non-shoulder boundary element is reached in the random walk, the MSB triggers flip-flop 24a, the output of which then goes high. If any subsequent data bit from the data source is a "1", the output of AND gate 24c will go high enabling NOR gate 24d which then produces the desired "boundary crossing" signal. If the boundary is arrived at on a shoulder element, the MSB of the element triggers flip-flop 24e, the output of which then goes high, enabling AND gate 24f which likewise enables NOR gate 24d thereby generating both a boundary crossing and a housekeeping bit signal.

The elemental/coded word detector 28, illustrated in detail in FIG. 6a and described below, controls the multiplexer 30 which selects the data register 22 if an elemental run is to be sent. In this case the contents (44 bits) of the data register are transferred to bits 2 through 45 of the output buffer register 32. Bit 1 of the output buffer register 32 contains the elemental/coded prefix in either case. If a coded run is sent, the multiplexer 30 hooks up the accumulator 26 to the output buffer register 32. The contents of the accumulator 26 which represents the coded suffix is transferred into bits 14 through 45 of the output buffer register 32. The starting point prefix is transferred from the N counter 18 into bits 4 through 13 of the output buffer register 32. The third bit of the output buffer register 32 contains the "shoulder" prefix which originates in the ROM 24 and determines if the starting point is located on a shoulder. The second bit of the output buffer register 32 contains the information as to whether the run is "0" or "1" coded. This is provided by the 0-1 code detector 34 illustrated in detail in FIG. 6b. The maximum number of words in any row of Pascal's triangle limited to 9 for the ROM implementation illustrated. The decision as to "0" or "1" coding is made prior to row 19. If W = 9 for N < 19, the data will be "1" coded. Otherwise it will be "0" coded. By providing this information, it is necessary to store only the left-hand side of Pascal's triangle. Of course, the decision as to "0" or "1" coding is made prior to the decision as to elemental or coded output. Therefore, even after the decision as to "0" or "1" coding, the block might still turn out to be elemental.

When the N counter 18 reaches a count of 44, the N = 44 line will go high. If a boundary crossing has already occurred, (W > 9) the "boundary crossing" line will be low. Therefore, the output of AND gate 36 will be low which will trigger the one shot 38. This causes the output buffer register 32 to read in the contents of the data register 22 through the multiplexer 30. If the boundary has not been crossed for N < 45, then the run will be coded and the one shot 38 will be triggered when the boundary is crossed causing the transfer of data to the output buffer register 32 from the accumulator 26 through the multiplexer 30.

If the boundary has not been crossed for N < 1024, the run will be terminated for N = 1023 since the Pascal's triangle has been truncated at this point. The "end of triangle" line from N counter 18 which is one of the inputs to OR gate 37 will go low causing the output of gate 36 to go low triggering the one shot 38 and causing the transfer of data to the output buffer register 32. The one shot 38 also causes the encoder 10 to reset. A 20 KHz clock from the modem (not shown) shifts the data serially into the modem for transmission to a terminal link.

Figure 6A:
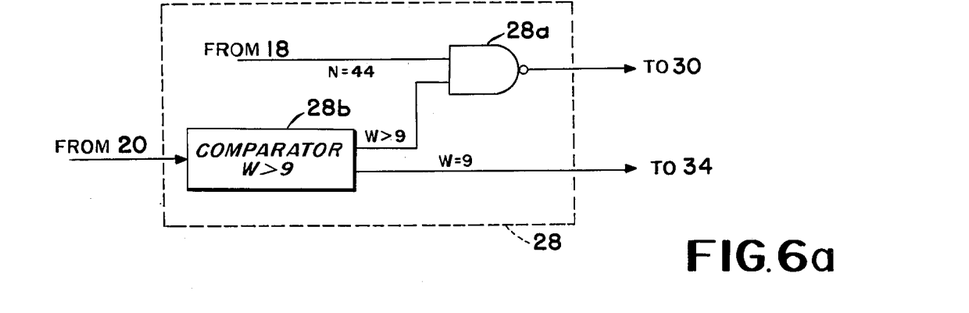
FIG. 6a is a network diagram of the elemental/coded word detector of the encoder.

The elemental/coded word detector is illustrated in FIG. 6a. The determination of whether the data is elemental or coded is made when N = 44. If the boundary has been crossed at this time, i.e., W > 9, then the data will be elemental; otherwise coded. Therefore it is necessary to examine only this point and no other. If a boundary has been crossed when N = 44 and W > 9, the output of NAND gate 28a, which receives one of its inputs from N counter 18 and the other from comparator 18b, will go low, causing multiplexer 30 to initiate the transfer of the data from the data register 22 to the output buffer register 32. If a boundary has not been crossed when N = 44, the data will be coded, the output of NAND gate 28a will remain high, indicating to the multiplexer 30 that a coded data block is being generated. When a boundary crossing occurs, data is transferred from accumulator 26 to buffer register 32 as described above.

Figure 6B:
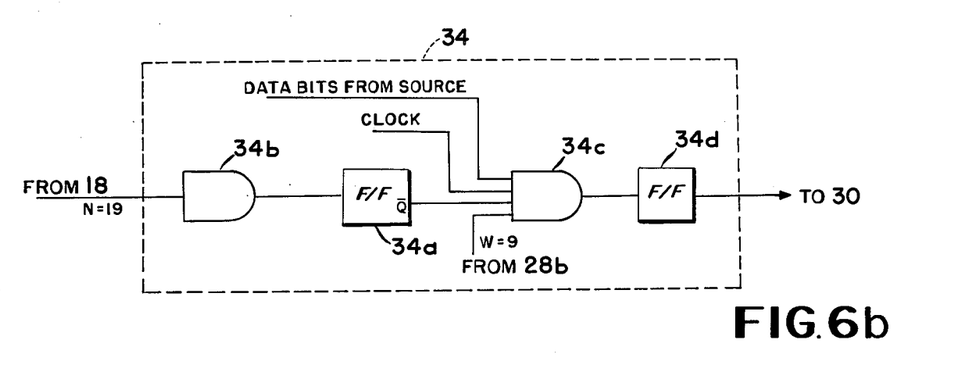
FIG. 6b is a network diagram of the 0-1 code detector of the encoder.
Figure 6C:
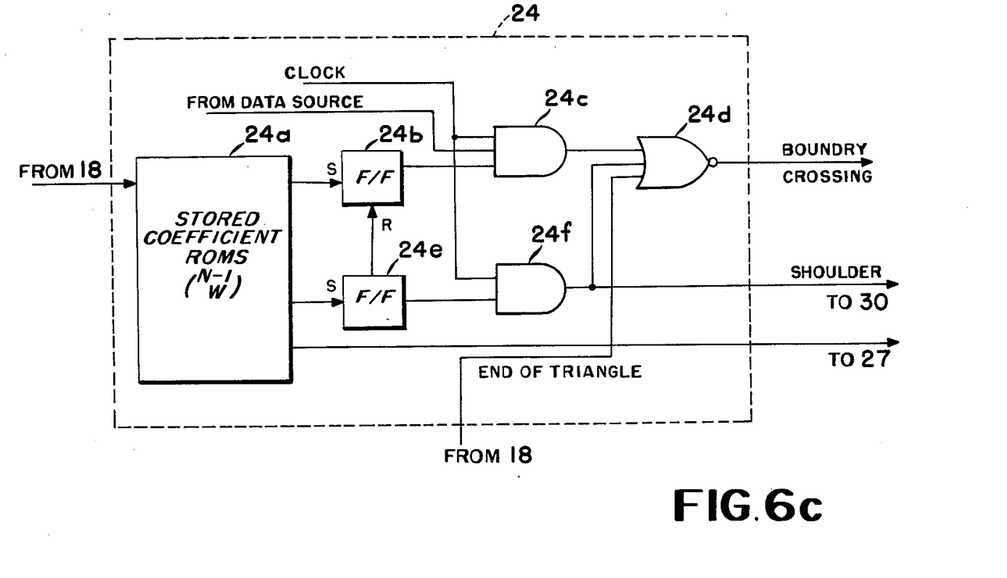
FIG. 6c is a network diagram of the boundary crossing generator portion of the encoder.

The 0-1 code detector is illustrated in FIG. 6b. At the start of the encoding process, flip-flop 34a is in the reset state, so that the $\bar{Q}$ output will be high until the N counter 18 reaches the count of 19, at which time flip-flop 34a will be set by the output from gate 34b and the $\bar{Q}$ output will go low. If the W counter 20 increments to 9 before the N counter reaches 19, the $W \geq 9$ comparator 28b will raise the W = 9 output enabling one input of AND gate 34c. If the data bit is a "1" at this time, the following clock pulse will cause the output of AND gate 34c to go high, setting flip-flop 34d and signifying that the data block is to be "1" coded.

Figure 7:
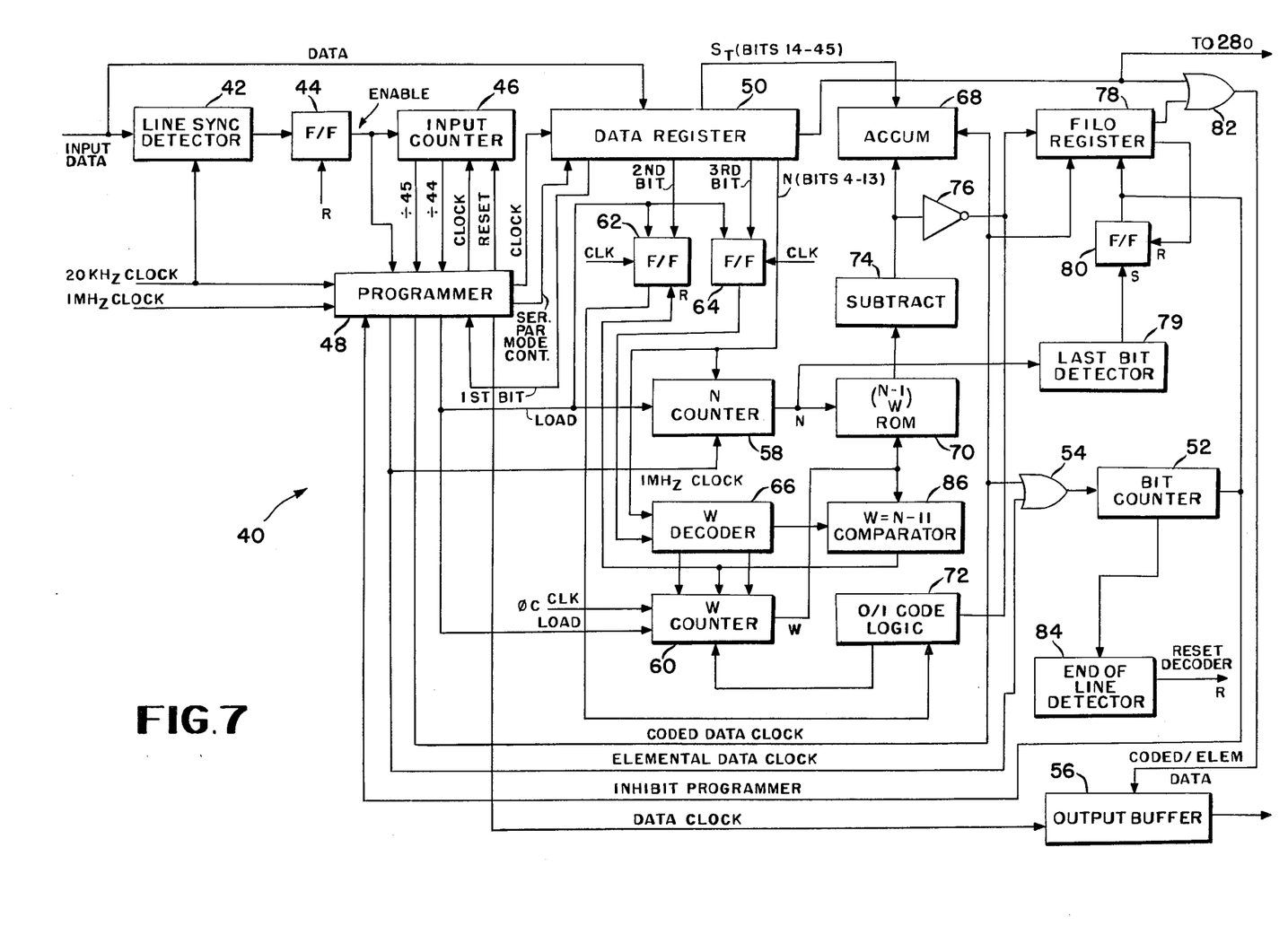
FIG. 7 is a network diagram of the decoder of the present invention.

The operation of the decoder 40 illustrated in FIG. 7 is as follows. The decoder line synchronization detector 42 triggers flip-flop 44 after detecting the synchronization word, enabling the input counter 46 and the programmer 48 illustrated in detail in FIG. 8. The programmer 48 passes the 20 KHz clock pulses which are synchronized with the data bits to the input counter 46 and the data register 50 which then receives the input data. When all 45 bits of the 45 bit data block have been received, the input counter 46 generates a pulse on the ÷ 45-line which is fed to the programmer 48 which then examines the first data bit in cell 45 of the data register 50. If the first data bit is a 0, signifying an elemental data block, the programmer 48 switches from the 20 KHz input to the 1 MHz clock input and transmits 1 MHz clock pulses to the input counter 46, data register 50 and bit counter 46, data register 50 and bit counter 52 via OR gate 54. Simultaneously, the mode control line from programmer 48 to the data register 50 is switched to the serial read-out mode.

The contents of the data register 50 (excluding the first identifier bit) are serially shifted out to the output buffer 56. After all 44 bits of data have been shifted out, the input counter 46 will read 89 (the first 45 20 KHz clock plus the following 44 1 MHz clock pulses) at which time the input counter 46 will transmit a pulse to the programmer 48 on the ÷ 44 line. At this time the programmer 48 resets the input counter 46 to 0 and switches back to the 20 KHz clock line to await the first data bit of the next block of data. Also the bit counter 52 will have counted the 44 elemental clock pulses generated by programmer 48.

If the first data bit is a "1" instead of a "0", signifying coded data, the programmer 48 will simultaneously perform the following functions: (1) switch the serial/parallel mode line to the parallel read-out mode; (2) reset the input counter 46 to 0; (3) switch the clock input line to the 1 MHz clock; (4) generate a load pulse to the N and W counters 58 and 60, respectively, and to flip-flop 62 and flip-flop 64; (5) initiate 1 MHz clock pulses on the coded data clock line. Flip-flops 62 and 64 will be set if the data is "1" coded and the shoulder bit is 1. Otherwise, they will remain in the reset condition. The N counter 58 will be preset to the value of N determined by bits 4 through 13 in the data register 50. The W decoder 66 which may comprise, for example, a programmed ROM, translates the value of N to a value W adjacent to a boundary in Pascal's triangle for that line but modified by the shoulder bit. If this bit (bit 3) is a 1, the value of W generated by the W decoder 66 will be greater by 1 than for a shoulder bit of 0. This number will be loaded into the W counter 60 upon application of the load pulse.

The sum $S_T$ which is generated by the encoder 10 and is the suffix carrying the rank of the sequence is contained in bits 14 through 45 of the data block. This is dumped into the accumulator 68 at the start of the decoding operation. The contents of the N counter 58 and the W counter 60 form the address to the decoding ROM 70 which generates $(_W{}^{N-1})$ from these inputs. The decoding operation is the inverse of the encoding process. Starting with the value of $(_W{}^{N-1})$ defined by the value of N at which the boundary crossing occurred, the operation $[S_T - (_wN^{-1})]$ is performed and the data bit stream is reconstructed in the reverse order from which it was produced, i.e., from the bottom of the triangle to the apex, in accordance with the following set of rules: (1) if the data is zero coded, $S_T < (_wN^{-1})$, generate a "0" bit and move to the element which is to the upper right of the starting value of $(_wN^{-1})$, i.e., generate a new $(_wN^{-1})$ for that position; (2) for "0" coded data, $S_T \geq (_wN^{-1})$, subtract $(_wN^{-1})$ from $S_T$, store the difference, which will be the new $S_T$ for the next operation, generate a "1" data bit and move one step upward to the left in Pascal's triangle, thereby generating a new $(_wN^{-1})$, continue in this fashion until the apex is reached; (3) if data is "1" coded and $S_T < (_wN^{-1})$, generate a "0" bit, and move one step upward to the left in Pascal's triangle, thereby generating a new $(_wN^{-1})$; (4) for "1" coded data, if $S_T \geq (_wN^{-1})$, perform the operation $[S_T - (_wN^{-1})]$ and store the difference as the new $S_T$. Generate a "1" data bit, and move upward to the right Pascal's triangle generating a new $(_wN^{-1})$.

It is to be noted that in the above decoding process the value of N is decreased for each reconstructed data bit, i.e., for each clock pulse. The value of W is decreased in accordance with the rules set forth above. These rules are implemented in the decoder 40 as follows.

For "0" coded data, flip-flop 62 is in the reset state and its Q output is fed to the 0/1 code logic 72 which may comprise, for example, an exclusive OR gate, which enables or disables the W counter 60 according to its inputs. The value of $(_wN^{-1})$ from the ROM 70 is subtracted from the value $S_T$ in the accumulator 68 by subtractor 74 and if $S_T \geq (_wN^{-1})$, the difference (which becomes the new $S_T$) is stored back in the accumulator 68. The most significant bit of the difference is a 0, using 2's complement arithmetic, which is inverted by inverter 76 and fed to the FILO (First In, Last Out) register 78 as a "1" data bit. Register 78 may comprise, for example, a RAM (random access memory) serially connected to an address counter. This same bit controls the accumulator 68 which enables it to store the difference word. The most significant bit is also fed to the 0/1 code logic 72 whose output enables the W counter 60 to decrement, thereby resulting in a step to the upper left of the triangle, since the N counter decrements for each decoded bit.

If $S_T < (_wN^{-1})$ for "0" coded data, the most significant bit of the difference is a "1", which again is inverted by the inverter 76 and fed to register 78 as a "0" data bit. The accumulator 68 is inhibited by this bit so that the difference is not stored. The 0/1 code logic 72 inhibits the W counter 60 for this condition so that the step is upward to the right in the triangle.

For "1" coded data, flip-flop 62 will be in the set state and its output will be high. Thus, if $S_T < (_wN^{-1})$, a "0" bit will be generated (most significant bit = 1) and the W counter 60 will be enabled, causing a shift to the upper left.

If $S_T \geq (_wN^{-1})$, a "1" will be generated and the W counter 60 disabled causing a step to the upper right.

During each step in the decoding process, register 78 is accumulating data. After the last bit of the data block has been generated the N counter 58 will decrement to 0. At this time, the last bit detector 79 which may comprise, for example, an N-bit NOR gate, will cause flip-flop 80 to set, which switches register 78 to the readout mode and enables the bit counter 52 to count clock pulses. The following N clock pulses read out the contents of the register 78 in the reverse order from which they enter, i.e., in the same order in which they were generated by the encoder. The data bits are passed through OR gate 82 to the output buffer 56. The bit counter 52 counts each data bit read out of the register 78. After the last data bit has been read out of the register 78, it generates a flag which resets flip-flop 80. This in turn places the register 78 in the write mode and signals the programmer 48 to stop sending any further clock pulses until the next complete 45 bit input data block has entered the data register 50. At this time a new cycle is initiated.

At the end of the line of data, the bit counter 52 triggers the end of line detector 84 which performs, for example, a NAND function and which resets the decoder 40 and terminates the operation until the following synchronization word is detected by the line sync detector 42.

In order to conserve hardware required for the storage of the elements of Pascal's triangle a maximum of the first nine words of each row need be stored. In the encoder 10, if the data was "1" coded the boundary W > 9 was crossed for N < 45 during the encoding process. At this point the W counter 60 was reset to N − 11, and the input data complemented. It is necessary to determine this point in the decoding process in order to reconstruct the data. The process is as follows: for "1" coded data, when W = N − 11, reset the W counter to 9 and continue the decoding process as for "0" coded data. This function is implemented in the decoder 40 by presetting the W counter 60 to 9 when the W = N − 11 comparator 86 detects the condition from its inputs from the N and W counters 58 and 60, and simultaneously resetting the flip-flop 62 to the "0" coded data condition (reset). This will cause the decoder to process the subsequent bits as for "0" coded data.

Figure 8:
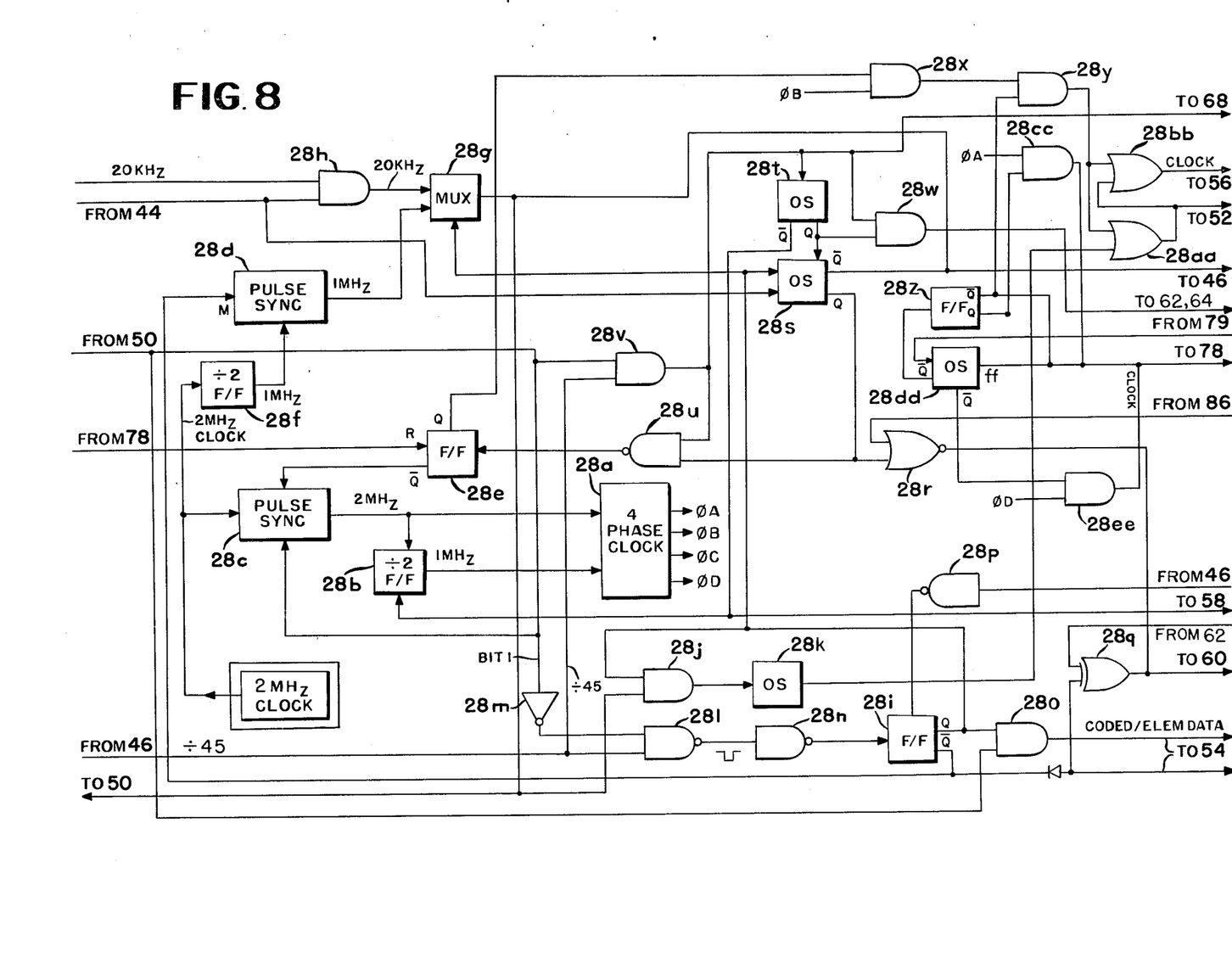
FIG. 8 is a network diagram of the programmer of the decoder illustrated in FIG. 7.

The programmer 48 of the decoder 40 is illustrated in detail in FIG. 8. Briefly, the programmer which functions as described above is implemented as follows, although it is to be understood that any device capable of performing the above described functions is within the scope of this invention. Four-phase clock 28a receives the inputs from frequency divider flip-flop 28b and pulse synchronizer 28c to produce clocks $\phi A$, $\phi B$, $\phi C$ and $\phi D$. Pulse synchronizer 28c has inputs from a 2 MHz clock and from flip-flop 28e which is reset by the output of FILO 78. Flip-flop 28f operates as a frequency divider and is connected to the 2 MHz clock at its input and to pulse synchronizer 28d at its output. The 1 MHz clock from synchronizer 28d is connected to multiplexer 28g which receives another input from AND gate 28h and its third input from flip-flop 28i. AND gate 28h has its bottom input connected to flip-flop 44 (FIG. 7) and its top input is derived from a 20 KHz clock (not shown). The output of multiplexer 28g is taken as one of the inputs to input counter 46 (FIG. 7), as an input to AND gate 28j, and as the clock to data register 50 (FIG. 7). One-shot 28k is pulsed by AND gate 28j. NAND gate 28l receives the ÷ 45 line from input counter 46 (FIG. 7) and the "1$^{st}$ Bit" line from data register 50 (FIG. 7), which is inverted at inverter 28m. The output of NAND gate 28l is the input to NAND gate 28n, the output of which is the set input to flip-flop 28i. The Q output of flip-flop 28i provides a first input to AND gate 28o, the second input of which is derived from the serial data output of data register 50 (FIG. 7). The output of AND gate 28o thus provides the "ELEMEN- TAL DATA" to OR gate 54 (FIG. 7). The reset input of 28*i* is derived from NAND gate 28*p* which receives its input from counter 46 (FIG. 7). The $\overline{Q}$ output of flip-flop 28*i* drives exclusive NOR gate 28*q* the output of which is the enable input to W counter 60 (FIG. 7). NOR gate 28*r* is inputted by comparator 86 and the Q output of one-shot 28*s* to output the "LOAD" line to W counter 60 (FIG. 7). One-shot 28*s* is controlled by inputs from flip-flop 44 (FIG. 7), flip-flop 28*i* and one-shot 28*t*. The $\overline{Q}$ output of 28*s* is connected to input counter 46 (FIG. 7) and the Q output is connected to NAND gate 28*u* which has a second input derived from AND gate 28*v*. One-shot 28*t* also receives an input from 28*v* and outputs its $\overline{Q}$ output to flip-flop 28*b*. The Q output of 28*t* is connected to AND gate 28*w* the output of which is the clock to flip-flops 62 and 64 (FIG. 7). The second input of AND gate 28*w* is derived from gate 28*v*. The output of flip-flop 28*e* is a first input to AND gate 28*x* which is also driven by $\phi B$ from the 4 phase clock 28*a* and serves to input AND gate 28*y* which is gated when it simultaneously receives a pulse from flip-flop 28*z*. OR gate 28*aa* is gated by either one-shot 28*k* or the AND gate 28*y* to pulse OR gate 28*bb* which provides the clock to output buffer 56 (FIG. 7). $\phi A$ input from clock 28*a* provides the clock to NAND 28*cc* which outputs pulses to FILO register 78. One-shot 28*dd* is triggered by the last bit detector 79 (FIG. 7) when the N counter 58 reaches a count of 0. The Q output of one-shot 28*dd* prevents the FILO 78 from incrementing to the next address by inhibiting the $\phi D$ clock pulse through AND gate 28*ee*, and also resets flip-flop 28*z*.

A modified approach to the above described technique may also be employed in the present invention with even better data compression properties. In this second approach, the encoding process begins as in the above described approach but instead of utilizing each boundary element as a possible starting point, Pascal's triangle is divided into a predetermined number of sectors and only those boundary elements in the last row of each sector are used as possible starting points for the decoder and are denoted as sector numbers. These starting points are at the shoulders of the locus of the boundary line.

The encoding process begins as described in the previous approach. Upon reaching a row element $(_wN)$ adjacent the boundary, the value of $(_wN-1)$ is added to the running suffix as before, assuming the element was arrived at as a result of a data source "1". In this case, however, the block is now terminated regardless of whether or not the next data bit is a binary "1". This means that the data block will include the last logic "1" data bit, which "1" data bit led to the element of Pascal's triangle adjacent to the boundary and that the decoder will generate a "1" for the first bit in the reconstructed decoder bit stream. Next, the value of the sector number associated with the region in which the boundary element was arrived at in the random walk is transmitted rather than the value of N (the starting point prefix). It is noted that in this scheme no housekeeping prefix is needed. If during the encoding process the random walk leads to an element in Pascal's triangle which lies in a row above a shoulder, but one element removed from the element adjacent to the boundary, the run is terminated and the value of the sector number in the next lowest sector in the triangle is transmitted. The value of $(_wN-1)$ is added to $S_T$ if the last data bit was a "1" as before. If the last bit that led to this element $(_wN)$ was a "0", the run is terminated, the value of the sector number in the next lowest sector in the triangle is transmitted but $(_wN-1)$ is not added since no step in the Y-direction had been taken.

At the decoder, the starting point is always at the last N boundary element in a sector. The decoder sets the N and W counters accordingly. Starting with the initial value $(_wN)$, the decoder performs the operation $[S_T - (_wN)]$; if $S_T > (_wN)$, a "1" is generated and if $S_T < (_wN)$, a "0" is generated. If the first data bit is a "0", this bit and all subsequent "0"'s are generated but are neither stored nor counted until a "1" is generated. The N counter is, however, decremented for each generated bit.

Figure 9:
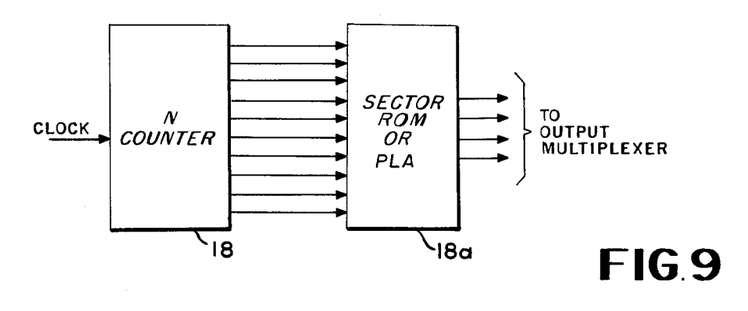
FIG. 9 is a network diagram of the encoder modifications necessary for the FIG. 5 implementation.

The encoder hardware modifications necessary for this scheme are illustrated in FIG. 9. A sector ROM 18*a* is added to the encoder and is programmed to generate a sector number corresponding to each shoulder in the boundary in Pascal's triangle, e.g., sector 9 for $0 < N \leq 48$; sector 8 for $48 < N \leq 58$; sector 7 for $58 < N \leq 74$; etc. Arrival at a boundary element causes the sector ROM 18*a* to generate a corresponding *x*-bit sector number which is transmitted to the decoder rather than the *y*-bit N number. Since no housekeeping bit is required a total of $(y - x) + 1$ less bits are needed. In the illustrated embodiment wherein $y = 10$, *x* would be 4 so that $(y - x) + 1 = 7$, thereby reducing the 45-bit block to 38 bits.

Figure 10:
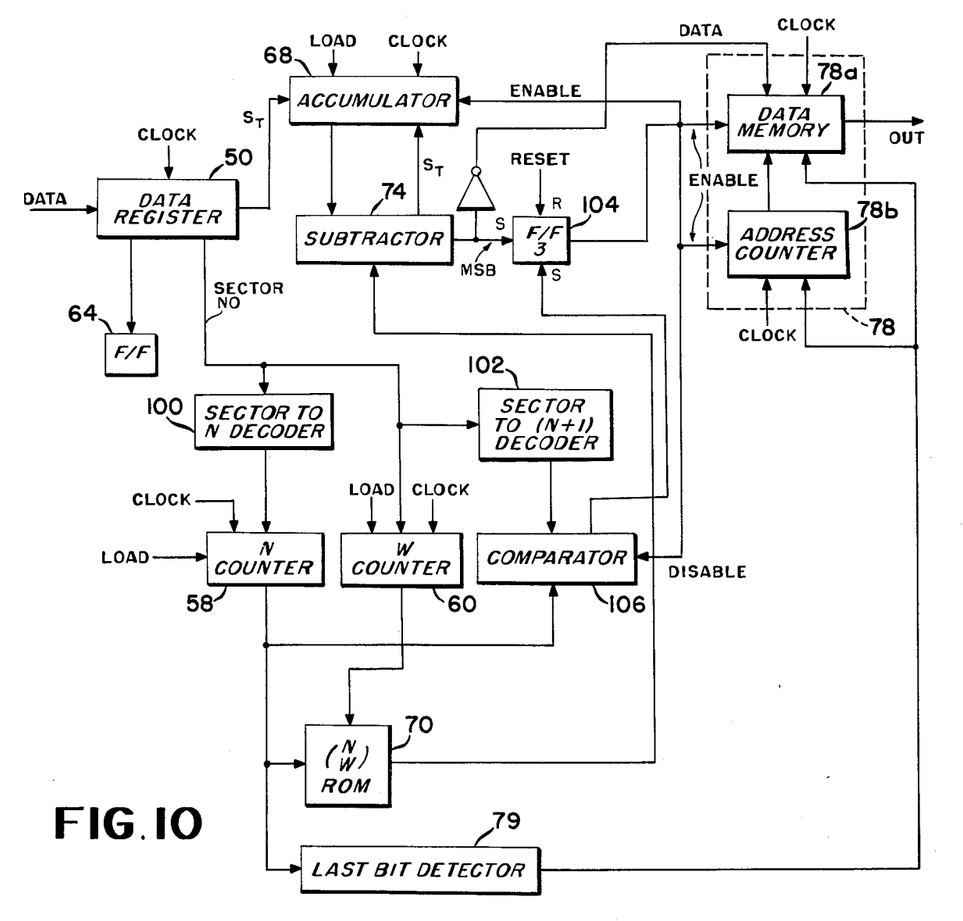
FIG. 10 is a network diagram of the decoder modifications necessary for the FIG. 5 implementation.

The decoder modifications for this scheme are illustrated in FIG. 10 wherein like reference numerals denote the corresponding components in FIG. 7. The modified decoder operates as follows. Upon receiving the data block, the sector-to-N decoder 100 which may comprise, for example, a programmed ROM translates the received sector number SN to the corresponding value of N (in the last row in the sector) which is then loaded into N counter 58. Simultaneously W counter 60 is set to the value of the sector number which is actually the number of the column in Pascal's triangle from which the run was terminated. At the same time the sector-to-(N + 1) decoder 102, which may comprise a programmed ROM, translates and stores the value of N corresponding to the value of the last row in the preceding sector (SN + 1). At this time flip-flop 104 is in the reset state which inhibits the clock to the accumulator 68, the data memory and address counter portions of FILO 78. However, the received $S_T$ is loaded into the accumulator 68 and the address counter 78*b* is set to "1" as in the previously described scheme.

The system clock is then turned on and the system operates in the normal manner; N and W counters 58 and 60, $(_wN)$ ROM 70 and the subtractor perform their respective functions. Initially the MSB from the subtractor will be a string of "0"'s unless the encoding run terminated at the shoulder of the boundary in Pascal's triangle. As long as the "0"'s are being generated, flip-flop 104 will remain reset, and the accumulator 68, data memory 78*a* and address counter 78*b* will be disabled. When the N counter 58 reaches the number of the row from which the run was terminated, ROM 70 will generate a number $(_wN)$ which is smaller than the value of $S_T$ stored in accumulator 68, at which time the MSB of the new $S_T$ will be a "1". This sets flip-flop 104 which then enables 68, 78*a* and 78*b* and the normal operation proceeds. If, however, N counter 58 decrements to the value of the last line of the preceding sector, i.e., N + 1, before a "1" bit is generated, the comparator 106 generates a signal which sets flip-flop 104 and initiates normal operation. This condition occurs if the run was terminated by arriving at that boundary element in Pascal's triangle occupying the row above a shoulder but displaced one element to that adjacent the boundary.

As an alternative to the illustrated embodiments it is to be noted that the elements of Pascal's triangle can be computed as the random walk takes place in Pascal's triangle rather than storing them in a ROM. Each row in Pascal's triangle can be generated if the row above it is known since each element is the sum of the two elements directly above it. Similarly, each row can be generated if the row directly below it is known since each element is the difference between the element directly beneath it to the left and the element on the same row to the immediate left. Therefore, the encoder can generate the necessary elements a row at a time by simple addition, storing only the row directly above it in memory. The decoder, which starts at the last row used in Pascal's triangle and works back to the apex, will generate each row from the row immediately beneath it. It would be necessary to store in memory the last element in each discontinuous row. This technique would greatly reduce the memory requirements but would slow down the rate of operation of the device. Schemes in which some of the elements of Pascal's triangle are computed and some are stored are also possible. For instance, every other row in Pascal's triangle may be stored and the missing rows generated from the existing rows. Although the present invention has been implemented for use with binary sources, it is to be understood that it could easily be extended for use with m-ary sources.

Thus a novel data compression apparatus and method have been disclosed which does not require knowledge of source statistics and attain near optimal performance with moderate equipment complexity at speeds higher than previously obtainable. The prior art problem of exponential growth of hardware necessary to store the elements of Pascal's triangle with increasing block length has also been overcome by the present invention. Moreover the technique of the present invention provides larger data compression ratios than previously obtainable in long, low entropy runs. Additionally, since incoming source bits are processed on a bit-by-bit basis, no table look-ups are required and the operations performed are very simple and the present scheme operates at high data rates. Finally, the present scheme is capable of handling not only runs all of whose elements are "0" or "1" as in run length coding but also runs which are predominantly "0" or "1" but containing some "1"'s or "0"'s.

Obviously many modifications and variations of the present invention are possible in the light of the above teachings. It is therefore to be understood that within the scope of the appended claims the invention may be practiced otherwise than as specifically described.

What is claimed is:

1. A data compression encoder for compressing a variable length $N_i$ stream of data bits into a block of $N_o$ encoded bits including a group of S bits indicative of the rank of said sequence comprising:

a first means for providing a predetermined set of the elements of Pascal's triangle such that $2^S - 1$ is the largest member of said set provided;

second means for initiating a random walk in said predetermined set of the elements in Pascal's triangle in response to receipt of said stream of data bits;

third means connected to said first means for accumulating the sums of the $W^{th}$ elements in the $(n - 1)^{st}$ rows of Pascal's triangle in response to receipt of each binary "1" data bit from said stream of data bits where $w$ is the current number of data stream "1"'s received and $n$ is the current member of data stream data bits received; and output means for accepting from said third means a group of S bits representative of the rank of said stream of data bits and for accepting from said second means a group of P bits representative of the length of said stream of data bits.

2. The encoder of claim 1 wherein said second means includes a data register for storing $N_o - 1$ of the $N_i$ data bits, said data register being connected to said output buffer means, said predetermined set provided by said first means including a coded element at the end of each incomplete row of Pascal's triangle.

3. The encoder of claim 2 wherein said second means includes first counter means for counting the number of data stream bits received and second counter means for counting the number of binary "1"'s in said data stream.

4. The encoder of claim 3 wherein said first means outputs a boundary crossing signal upon the arrival at one of said coded elements in said random walk in Pascal's triangle;

detector means connected to said first counter means for outputting a first ouput signal if said boundary crossing signal occurred prior to a count of $N_o$ by said first counter means and for outputting a second output signal if said boundary crossing signal occurred after a count of $N_o$ by said first counter means.

5. The encoder of claim 4 wherein said output means includes a multiplexer connected to said detector means and an output buffer register connected to said multiplexer.

6. The encoder of claim 5 wherein in response to receipt of said first output signal from said detector means, said multiplexer effectuates the transfer of the contents of said data register into said output buffer register.

7. The encoder of claim 6 wherein in response to receipt of said second output signal from said detector means, said multiplexer effectuates the transfer of the contents of said third means into said output buffer register.

8. The encoder of claim 5 further including 0/1 detector means connected to said first and second counter means for outputting a "1" code signal if a predetermined number of binary "1"'s has been received and for outputting a "0" code signal if said predetermined number of binary "1"'s has not been received.

9. The encoder of claim 8 including starting point means connected to said first counter means and to said multiplexer for outputting a starting point code sequence of P bits to said buffer register.

10. The encoder of claim 9 further including termination means for terminating said random walk in response to said boundary crossing signal and in response to said first counter reaching a predetermined count;

said first means outputting a bit to said output buffer register, said bit having a first value if said random walk terminated on the last element in a row of said set of elements of Pascal's triangle and having a second value if said random walk terminated on the next to last element in a row of said set of elements of Pascal's triangle.

11. A data compression decoder for expanding $N_o$ encoded bits including a group of S bits into a sequence of $N_i$ data bits, said S bits being indicative of the rank of said sequence comprising:
first means for accepting exactly $N_o$ bits;
starting point means for determining the element of Pascal's triangle to be used as a starting point for a random walk in Pascal's triangle;
second means for providing a predetermined set of the elements of Pascal's triangle such that $2^S - 1$ is the largest member of said set provided;
third means for performing a random walk in said predetermined set of the elements of Pascal's triangle beginning at the starting point determined by said starting point means;
fourth means connected to said third means for storing a sequence of $N_i$ data bits such that each of said data bits has a value dependent upon the steps of said random walk;
output register means connected to said fourth means;
whereby knowledge of the source statistics is not required in reconstructing said sequence of $N_i$ data bits.

12. The decoder of claim 11 including coded/elemental means connected to said first means for determining if said $N_o$ bits constitute a coded sequence or an elemental sequence and for initiating transfer of said sequence of $N_i$ data bits from said first means to said output register means if said $N_o$ bits constitute an elemental sequence.

13. The decoder of claim 11 wherein said third means includes 0/1 detector means connected to said first means for enabling said random walk in either a first mode or a second mode.

14. A data compression system for encoding a variable length $N_i$ sequence of data bits into a block of $N_o$ encoded bits including S bits indicative of the rank of said sequence and for decoding said $N_o$ bits into said $N_i$ sequence of data bits comprising:

an encoder including first encoder means for providing a predetermined set of the elements of Pascal's triangle such that $2^S - 1$ is the largest member of said set provided;
said encoder further including second encoder means for initiating a random walk in said predetermined set of the elements of Pascal's triangle in response to receipt of said sequence of data bits;
said encoder further including third encoder means connected to said first means for determining the rank of said $N_i$ sequence of data bits;
said encoder further including output means for accepting from said third encoder means a group of S bits indicative of said rank and for accepting from said second encoder means a group of P bits representative of the length of said sequence of data bits and for outputting $N_o$ bits including said S bits and said P bits;
said system further comprising a decoder for decoding said $N_o$ bits into said $N_i$ sequence of data bits.

15. The system of claim 14 wherein said decoder comprises:
first means for accepting exactly $N_o$ bits;
starting point means for determining the element of Pascal's triangle to be used as a starting point for a random walk in Pascal's triangle;
second means for providing a predetermined set of the elements of Pascal's triangle such that $2^S - 1$ is the largest member of said set provided;
third means for performing a random walk in said predetermined set of the elements of Pascal's triangle beginning at the starting point determined by said starting point means;
fourth means connected to said third means for storing a sequence of $N_i$ data bits such that each of said data bits has a value dependent upon the steps of said random walk;
output register means connected to said fourth means;
whereby knowledge of the source statistics is not required in reconstructing said sequence of $N_i$ data bits.

* * * * *